United States Patent
Banna et al.

(10) Patent No.: US 8,974,684 B2
(45) Date of Patent: Mar. 10, 2015

(54) SYNCHRONOUS EMBEDDED RADIO FREQUENCY PULSING FOR PLASMA ETCHING

(75) Inventors: Samer Banna, San Jose, CA (US); Ankur Agarwal, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 20 days.

(21) Appl. No.: 13/458,191

(22) Filed: Apr. 27, 2012

(65) Prior Publication Data

US 2013/0105443 A1 May 2, 2013

Related U.S. Application Data

(60) Provisional application No. 61/552,707, filed on Oct. 28, 2011.

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| H01L 21/302 | (2006.01) |
| H01L 21/461 | (2006.01) |
| H01J 37/32 | (2006.01) |
| H01L 21/311 | (2006.01) |

(52) U.S. Cl.
CPC ......... H01J 37/321 (2013.01); H01L 21/31116 (2013.01); H01J 37/32146 (2013.01); H01J 37/32165 (2013.01)
USPC ............. 216/67; 438/689; 438/706; 438/709; 438/710; 438/714

(58) Field of Classification Search
None
See application file for complete search history.

(56) References Cited

U.S. PATENT DOCUMENTS

| | | | |
|---|---|---|---|
| 2009/0284156 A1* | 11/2009 | Banna et al. | 315/111.21 |
| 2010/0248488 A1* | 9/2010 | Agarwal et al. | 438/714 |
| 2011/0094683 A1 | 4/2011 | Chen et al. | |
| 2011/0094994 A1 | 4/2011 | Todorow et al. | |
| 2011/0097901 A1 | 4/2011 | Banna et al. | |

OTHER PUBLICATIONS

S. Samukawa, et al., "Pulse-time Modulated Plasma Discharge for Highly Selective, Highly Anisotropic and Charge-free Etching." Plasma Sources Sci. Technol. 5, 132 (1996). United Kingdom. pp. 132-138.
S. Samukawa, et al., "Reduction of Plasma Induced Damage in an Inductively Coupled Plasma Using Pulsed Sourced Power." J. Vac. Sci. Technol. B 18(2), Mar./Apr. 2000, pp. 834-840.
S.K. Kanakasabapathy et al., "Alternating Fluxes of Positive and Negative Ions from an Ion—Ion Plasma." Appl Phys. Lett. 78 (1), 22 (2001). pp. 22-24.

(Continued)

*Primary Examiner* — Stephanie Duclair
(74) *Attorney, Agent, or Firm* — Moser Taboada; Alan Taboada

(57) ABSTRACT

Methods for etching a substrate are provided herein. In some embodiments, a method of etching a substrate may include generating a plasma by providing only a first RF signal having a first frequency and a first duty cycle; applying only a second RF signal to bias the plasma towards the substrate, wherein the second RF signal has the first frequency and a second duty cycle different than the first duty cycle; adjusting a phase variance between the first and second RF signals to control an ion energy distribution in the plasma; and etching the substrate with the plasma.

18 Claims, 5 Drawing Sheets

(56) References Cited

OTHER PUBLICATIONS

P. Subramonium et al., "Pulsed Inductively Coupled Chlorine Plasmas in the Presence of a Substrate Bias." Appl. Phys. Lett. 79, 2145, Oct. 2001. pp. 2145-2147.

P. Subramonium et al., "Two-Dimensional Modeling of Long-Term Transients in Inductively Coupled Plasmas Using Moderate Computational Parallelism. II. Ar/$Cl_2$ Pulsed Plasmas." J. Vac. Sci. Technol. A 20 (2), Mar./Apr. 2002. pp. 325-334.

A. Agarwal, et al., "Effect of Simultaneous Source and Bias Pulsing in Inductively Coupled Plasma Etching." J. Appl. Phys. 106, 103305 (2009). pp. 103305-1-103305-12.

M.J. Kushner, J. "Hybrid Modelling of Low Temperature Plasmas for Fundamental Investigations and Equipment Design." Phys. D: Appl. Phys. 42, 194012 (2009). pp. 1-20.

K. Tokashiki, et al., "Synchronous Pulse Plasma Operation Upon Source and Bias Radio Frequencys for Inductively Couples Plasma for Highly Reliable Gate Etching Technology." Jpn. J. Appl. Phys. 48, (2009). pp. 08HD01-1-08HD01-11.

S. Banna, et al., "Inductively Coupled Pulsed Plasmas in the Presence of Synchronous Pulsed Substrate Bias for Robust, Reliable, and Fine Conductor Etching." Trans. Plasma Sci. 37, 1730 (2009). pp. 1730-1746.

G. Gunge, et al., "Gas Convection Caused by Electron Pressure Drop in the Afterglow of a Pulsed Inductively Coupled Plasma Discharge." Applied Physics Letter, 96, 131501 (2010). pp. 13150-1-131501-3.

\* cited by examiner

US 8,974,684 B2

SYNCHRONOUS EMBEDDED RADIO FREQUENCY PULSING FOR PLASMA ETCHING

CROSS-REFERENCE TO RELATED APPLICATIONS

This application claims benefit of U.S. provisional patent application Ser. No. 61/552,707, filed Oct. 28, 2011, which is herein incorporated by reference.

FIELD

Embodiments of the present invention generally relate to methods of plasma processing.

BACKGROUND

Conventional plasma etching of dielectric structures on workpieces has issues of reactive ion etch (RIE) lag (e.g., aspect ratio dependent etching), etch stop, or twisting of features etched. This is due in part to both competing polymer deposition mechanism using a fluorocarbon etch chemistry, and positive charging of the structure walls from predominantly positive ion fluxes and unequal electron fluxes down the depth of the structure. In addition, this charging leads to selectivity and damage issues, especially to the soft films encountered in dielectric etching. For example, some materials, such as insulating materials (e.g., dielectric materials) can charge during plasma etch processing. The charging of the material can result in damage, destruction, or over-etching of the material due to, for example, increased flux of a plasma species at a charged surface of the material.

Solutions to the surface charging problem include, for example, pulsing the RF source and bias frequencies to dissipate charge from the surface of the material. Typically, the pulsing of the RF source and bias signals is synchronized such that each RF signal is completely aligned, e.g., each signal is in phase and has the same duty cycle. However, the inventors have discovered that this type of synchronization does not effectively compensate for variations in the plasma due to the pulsing process which can result in a non-uniform plasma and a poorly controlled etch rate. The inventors have further discovered that this type of synchronization does not effectively compensate for a low ion density at initial plasma formation or the transition from an afterglow, e.g., where the RF source is in an "off" portion of the pulse period but some small plasma density remains, to an active glow, e.g., where the RF source is in an "on" portion of the pulse period. For example, at the leading edge of the "on" portion of the RF bias pulse period (i.e., synchronous with the leading edge of the "on" portion of the RF source pulse period), ions may attain high energies due to the application of the RF bias potential to an initially small plasma density at the leading edge of the "on" portion of the pulse period. Although these high energy ions arrive at the substrate for only about 2 to about 4 percent of the pulse period, the flux of the high energy ions is substantial enough to cause ion bombardment damage.

Accordingly, the inventors have provided improved methods for plasma processing.

SUMMARY

Methods for etching a substrate are provided herein. In some embodiments, a method of etching a substrate may include generating a plasma by providing only a first RF signal having a first frequency and a first duty cycle; applying only a second RF signal to bias the plasma towards the substrate, wherein the second RF signal has the first frequency and a second duty cycle different than the first duty cycle; adjusting a phase variance between the first and second RF signals to control an ion energy distribution in the plasma; and etching the substrate with the plasma.

In some embodiments, a method of etching a substrate disposed on a substrate support in the processing volume of an inductively coupled plasma etching reactor having one or more inductive coils disposed above the substrate support and external of the processing volume and an electrode disposed in the substrate support, may include generating a plasma by providing only a first RF signal having a first frequency and a first duty cycle; applying only a second RF signal to bias the plasma towards the substrate, wherein the second RF signal has the first frequency and a second duty cycle different than the first duty cycle; adjusting a phase variance between the first and second RF signals to control an ion energy distribution in the plasma; and etching the substrate with the plasma.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
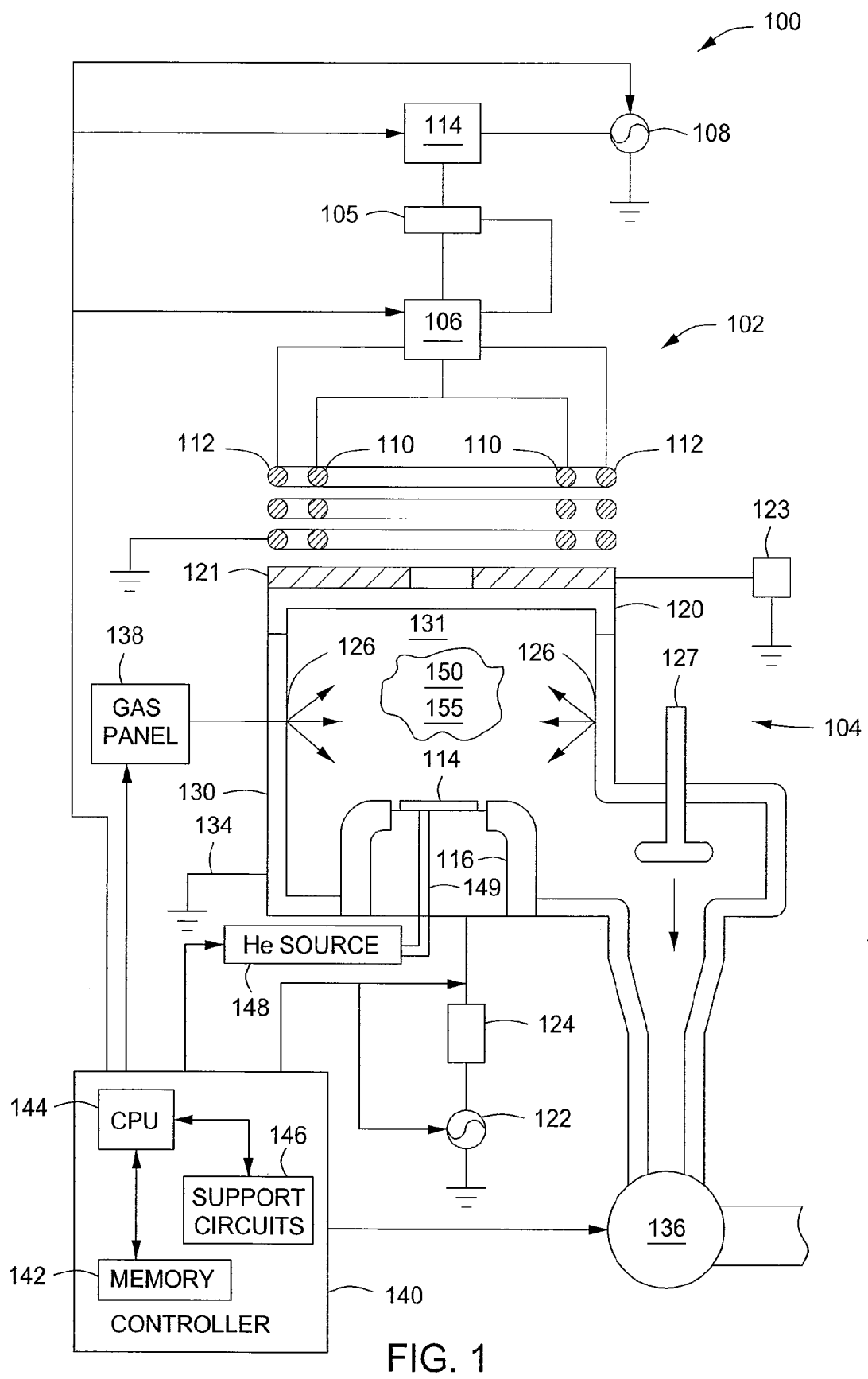
FIG. 1 depicts a schematic side view of an inductively coupled plasma reactor in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods of processing a substrate are provided herein. The inventive methods may advantageously reduce ion bombardment damage on a substrate. Further, the inventive methods may advantageously reduce charge-up on surfaces of a substrate, such as a dielectric layer, while improving plasma uniformity and etch rate control. The inventive methods may advantageously benefit low or high aspect ratio etching and act towards preventing charging damage in low k dielectric materials. Further, the inventive methods may advantageously benefit conductor etch applications.

FIG. 1 depicts a schematic side view of an inductively coupled plasma reactor (reactor 100) in accordance with some embodiments of the present invention. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. Suitable exemplary plasma reactors that may be utilized with the inventive methods disclosed herein may be found in U.S. patent application Ser. No. 12/821,609, filed Jun. 23, 2010 by V. Todorow, et al., and entitled, "INDUCTIVE COUPLED PLASMA APPARATUS," or U.S. patent application Ser. No. 12/821,636, filed Jun. 23, 2010 by S. Banna, et al., and entitled, "DUAL MODE INDUCTIVELY COUPLED PLASMA REACTOR WITH ADJUSTABLE PHASE COIL ASSEMBLY."

The reactor 100 includes an inductively coupled plasma apparatus 102 disposed atop a process chamber 104. The inductively coupled plasma apparatus includes an RF feed structure 106 for coupling an RF power source 108 to a plurality of RF coils, e.g., a first RF coil 110 and a second RF coil 112. The plurality of RF coils are coaxially disposed proximate the process chamber 104 (for example, above the process chamber) and are configured to inductively couple RF power into the process chamber 104 to form or control a plasma from process gases provided within the process chamber 104.

The methods of the present invention may benefit a reactor configured for standard mode, where RF current flowing along the first RF coil 110 is in-phase with RF current flowing along the second RF coil 112, or dual mode, where the RF current flowing along the first RF coil 110 can be selectively in-phase or out-of-phase with RF current flowing along the second RF coil 112. For example, dual mode ICP sources may be used to eliminate M-shape and improve etch rate (ER) uniformity. For example, the reactor 100 as described herein is configured for dual mode operation. For example, an inventive method 200 (discussed below) may be utilized with standard or dual mode operation.

The RF power source 108 is coupled to the RF feed structure 106 via a match network 114. A power divider 105 may be provided to adjust the RF power respectively delivered to the first and second RF coils 110, 112. The power divider 105 may be coupled between the match network 114 and the RF feed structure 106. Alternatively, the power divider may be a part of the match network 114, in which case the match network will have two outputs coupled to the RF feed structure 106—one corresponding to each RF coil 110, 112. The power divider 105 is discussed in more detail below.

The RF feed structure 106 couples the RF current from the power divider 105 (or the match network 114 where the power divider is incorporated therein) to the respective RF coils. For example, suitable exemplary RF feed structures that may be utilized with the inventive methods disclosed herein may be found in U.S. patent application Ser. No. 12/821,626, filed Jun. 23, 2010 by Z. Chen, et al., and entitled, "RF FEED STRUCTURE FOR PLASMA PROCESSING." In some embodiments, the RF feed structure 106 may be configured to provide the RF current to the RF coils in a symmetric manner, such that the RF current is coupled to each coil in a geometrically symmetric configuration with respect to a central axis of the RF coils, such as by a coaxial structure.

The reactor 100 generally includes the process chamber 104 having a conductive body (wall) 130 and a dielectric lid 120 (that together define a processing volume 131), a substrate support pedestal 116 disposed within the processing volume, the inductively coupled plasma apparatus 102, and a controller 140. The wall 130 is typically coupled to an electrical ground 134. In some embodiments, the support pedestal 116 may provide a cathode coupled through a matching network 124 to a RF power source 122. The RF power source 122 may illustratively be a source of up to about 1000 W (but not limited to about 1000 W) at a frequency of approximately 13.56 MHz that is capable of producing either continuous or pulsed power, although other frequencies and powers may be provided as desired for particular applications. For example, the RF power source 122 may provide RF energy at a frequency of between about 400 kHz to about 27 MHz, or more. Non-limiting examples of suitable frequencies include 400 kHz, 2 MHz, 13.56 Mhz, or 27 MHz. In other embodiments, the source 122 may be a DC or pulsed DC source. In some embodiments, the source 122 may be capable of providing multiple frequencies or one or more second sources (not shown) may be coupled to the pedestal 116 through the same matching network 124 or one or more different matching networks (not shown) to provide multiple frequencies.

In some embodiments, a link (not shown) may be provided to couple the RF power source 108 and the RF power source 122 to facilitate synchronizing the operation of one source to the other. Either RF source may be the lead, or master, RF generator, while the other generator follows, or is the slave. The link may further facilitate operating the RF power source 108 and the RF power source 122 in perfect synchronization, or in a desired offset, or phase difference. The phase control may be provided by circuitry disposed within either or both of the RF source or within the link between the RF sources. This phase control between the source and bias RF generators (e.g., 108, 122) may be provided and controlled independent of the phase control over the RF current flowing in the plurality of RF coils coupled to the RF power source 108. Further details regarding phase control between the source and bias RF generators may be found in U.S. patent application Ser. No. 12/465,319, filed May 13, 2009 by S. Banna, et al., and entitled, "METHOD AND APPARATUS FOR PULSED PLASMA PROCESSING USING A TIME RESOLVED TUNING SCHEME FOR RF POWER DELIVERY."

In some embodiments, the dielectric lid 120 may be substantially flat. Other modifications of the chamber 104 may have other types of lids such as, for example, a dome-shaped lid or other shapes. The inductively coupled plasma apparatus 102 is typically disposed above the lid 120 and is configured to inductively couple RF power into the process chamber 104. The inductively coupled plasma apparatus 102 includes the first and second coils 110, 112, disposed above the dielectric lid 120. The relative position, ratio of diameters of each coil, and/or the number of turns in each coil can each be adjusted as desired to control, for example, the profile or density of the plasma being formed via controlling the inductance on each coil. Each of the first and second coils 110, 112 is coupled through the matching network 114 via the RF feed structure 106, to the RF power source 108. The RF power source 108 may illustratively be capable of producing up to about 4000 W (but not limited to about 4000 W) at a tunable frequency in a range from 50 kHz to 13.56 MHz, although other frequencies and powers may be provided as desired for particular applications. For example, the RF power source 108 may provide RF energy at a frequency of between about 400 kHz to about 27 MHz, or more. Non-limiting examples of suitable frequencies include 400 kHz, 2 MHz, 13.56 Mhz, or 27 MHz.

The first and second RF coils 110, 112 can be configured such that the phase of the RF current flowing through the first RF coil can be out-of-phase with respect to the phase of the RF current flowing through the second RF coil. As used herein with respect to the first and second RF coils 110, 112, the term "out-of-phase" can be understood to mean that the RF current flowing through the first RF coil is flowing in an opposite direction to the RF current flowing through the second RF coil, or that the phase of the RF current flowing through the first RF coil is shifted with respect to the RF current flowing through the second RF coil.

For example, in conventional apparatus, both RF coils are typically wound in the same direction. As such, the RF current is flowing in the same direction in both coils, either clockwise or counterclockwise. The same direction of the winding dictates that the RF current flowing in the two RF coils are always in phase. In embodiments of the present invention, RF current may be provided out-of-phase between the two coils by either external means or by physically winding one of the coils in the opposite direction. By controlling the phase between the coils, an embodiment of the invention has the ability to reduce and eliminate non-uniform etch results, such as the M-shape etch pattern, and furthermore to control the processing (such as etch rate) pattern from center high, to edge high or to a flat and uniform processing pattern. By providing out-of-phase RF current between the coils and by controlling the current ratio between the inner and outer coil, the apparatus facilitates control over the processing pattern to achieve improved uniformity across the substrate.

By providing out-of-phase RF current between the coils, the apparatus reverses the destructive interference between the magnetic fields generated by each coil to be constructive, and, therefore, the typical constructive electric field plasma properties within the reactor may be similarly reversed. For example, the present apparatus may be configured to increase the electric field proximate each of the first and second coils and decrease the electric field between the coils by providing out of phase RF current flowing along the first and second coils. In some embodiments, such as where the RF current in each of the coils is completely out of phase (e.g., reverse current flow or 180 phase difference) the electric fields may be maximized (or localized) proximate each of the first and second coils and minimized (or null) between the coils due to destructive interference between opposing electric fields. A plasma formed using such a coil configuration can advantageously have an improved, e.g., a more uniform, electric field distribution and that components of the plasma may diffuse into the null region of the electric field to provide a more uniform plasma.

In some embodiments, the direction of the RF current flowing through each coil can be controlled by the direction in which the coils are wound. For example, in some embodiments, the first RF coil 110 may be wound in a first direction and the second RF coil 112 may be wound in a second direction which may be opposite the first direction. Accordingly, although the phase of the RF signal provided by the RF power source 108 is unaltered, the opposing winding first and second directions of the first and second RF coils 110, 112 cause the RF current to be out of phase, e.g., to flow in opposite directions effectively producing a 180° phase shift.

Further, additional embodiments of the RF coils are possible, each RF coil need not be a singular continuous coil, and may each be a plurality (e.g., two or more) of interlineated and symmetrically arranged stacked coil elements. Further details regarding RF coils comprising interlineated and symmetrically arranged stacked coil elements may be found in commonly owned, U.S. patent application Ser. No. 12/821,609, filed Jun. 23, 2010 by V. Todorow, et al., and entitled, "INDUCTIVELY COUPLED PLASMA APPARATUS."

In some embodiments, a power divider 105, such as a dividing capacitor, may be provided between the RF feed structure 106 and the RF power source 108 to control the relative quantity of RF power provided to the respective first and second coils. For example, as shown in FIG. 1, a power divider 105 may be disposed in the line coupling the RF feed structure 106 to the RF power source 108 for controlling the amount of RF power provided to each coil (thereby facilitating control of plasma characteristics in zones corresponding to the first and second coils). In some embodiments, the power divider 105 may be incorporated into the match network 114. In some embodiments, after the power divider 105, RF current flows to the RF feed structure 106 where it is distributed to the first and second RF coils 110, 112. Alternatively, the split RF current may be fed directly to each of the respective first and second RF coils.

During start up of the reactor 100, after a cleaning process, periodically, or whenever desired or needed, the reactor 100 may be calibrated so as to insure that setup value of the power divider 105 at the user interface is providing a desired ratio of RF power to the plurality of RF coils, such as the first and second coils 110, 112 of the reactor 100.

A heater element 121 may be disposed atop the dielectric lid 120 to facilitate heating the interior of the process chamber 104. The heater element 121 may be disposed between the dielectric lid 120 and the first and second coils 110, 112. In some embodiments. the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thereby facilitating uniform plasma formation within the process chamber 104.

During operation, a substrate 114 (such as a semiconductor wafer or other substrate suitable for plasma processing) may be placed on the pedestal 116 and process gases may be supplied from a gas panel 138 through entry ports 126 to form a gaseous mixture 150 within the process chamber 104. The gaseous mixture 150 may be ignited into a plasma 155 in the process chamber 104 by applying power from the plasma source 108 to the first and second coils 110, 112 and optionally, the one or more electrodes (not shown). In some embodiments, power from the bias source 122 may be also provided to the pedestal 116. The pressure within the interior of the chamber 104 may be controlled using a throttle valve 127 and a vacuum pump 136. The temperature of the chamber wall 130 may be controlled using liquid-containing conduits (not shown) that run through the wall 130.

The temperature of the wafer 114 may be controlled by stabilizing a temperature of the support pedestal 116. In one embodiment, helium gas from a gas source 148 may be provided via a gas conduit 149 to channels defined between the backside of the wafer 114 and grooves (not shown) disposed in the pedestal surface. The helium gas is used to facilitate heat transfer between the pedestal 116 and the wafer 114. During processing, the pedestal 116 may be heated by a resistive heater (not shown) within the pedestal to a steady state temperature and the helium gas may facilitate uniform heating of the wafer 114. Using such thermal control, the wafer 114 may illustratively be maintained at a temperature of between 0 and 500 degrees Celsius.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 446 are coupled to the CPU 144 for supporting the processor in a conventional manner. These circuits include cache, power supplies, clock circuits, input/output circuitry and sub-systems, and the like. The memory 142 stores software (source or object code) that may be executed or invoked to control the operation of the reactor 100 in the manner described below. Specifically, memory 142 stores a calibration module 190 that is executed to calibrate the ratio of current or power applied to the coils 110 and 112. The software routine may also be stored and/or executed by a second CPU (not shown) that is remotely located from the hardware being controlled by the CPU 144.

Figure 2:
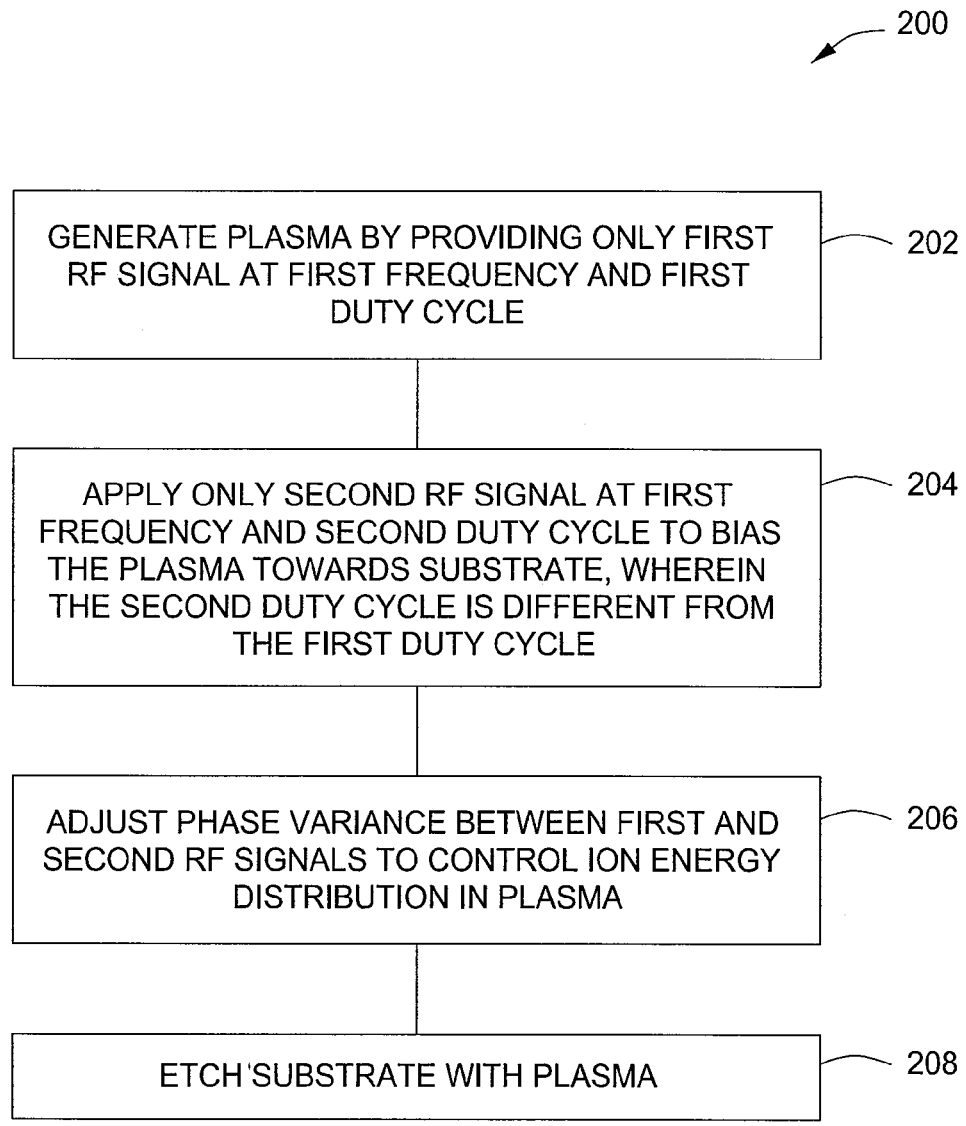
FIG. 2 depicts a flow chart of a method for etching a layer on a substrate in accordance with some embodiments of the present invention.

FIG. 2 depicts a flow chart of a method 200 for etching a substrate in accordance with some embodiments of the present invention. The method 200 may be performed, for example, in the plasma reactor discussed above and illustrated in FIG. 1. The method 200 begins at 202 by generating a plasma by providing only a first RF signal (e.g., first RF signal 302 as illustrated in FIGS. 3B-E) having a first frequency and a first duty cycle, for example, such as a signal provided by the RF power source 108. The first frequency may be any suitable frequency necessary for the application. For example, in some embodiments, the first frequency may be about 400 kHz to about 27 MHz. In some embodiments, the first frequency is about 13.56 MHz.

Figure 3A:
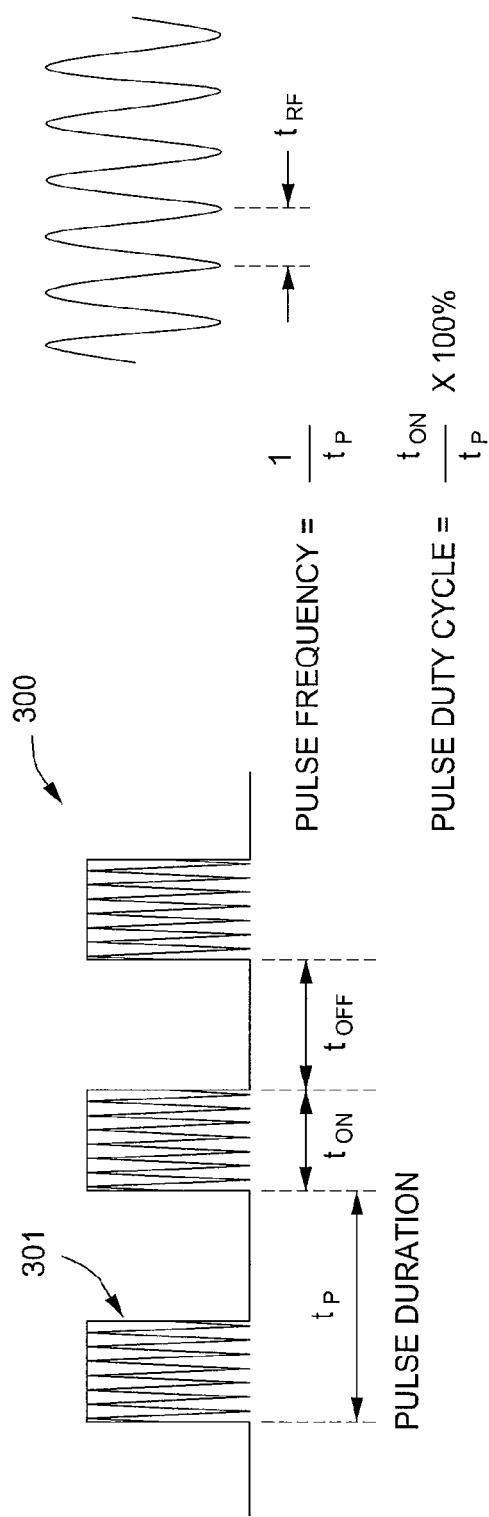
FIG. 3A-E depicts pulsed waveforms of radio frequency signals in accordance with some embodiments of the present invention.

For example, FIG. 3A depicts a time domain waveform diagram that may illustrate a pulsed RF output 300 from each of the RF power sources 108, 122 showing the pulse envelope 301 of the pulsed RF output 300, characterized by the following parameters controlled by the controller 140 or a separate pulse controller (not shown) individually for each RF power source 108, 122: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

Accordingly, based on the features of a pulsed RF output 300 as defined above and illustrated in FIG. 3A, the first RF signal 302 may have a first pulse duration, for example, ranging from about 0.01 milliseconds to about 0.1 seconds. The first RF signal 302 may have a pulse frequency ranging from about 10 Hz to about 100 kHz, or in some embodiments, about 0.1 to about 20 kHz. The first duty cycle may range from about 1 to about 99 percent, or in some embodiments, about 10 to about 90 percent. In some embodiments, the first duty cycle may be about 75 percent. The first RF signal 302 may be provided at a first power, for example, ranging from about 10 to about 3000 watts. In some embodiments, the first power may be about 300 watts.

Figure 3B:
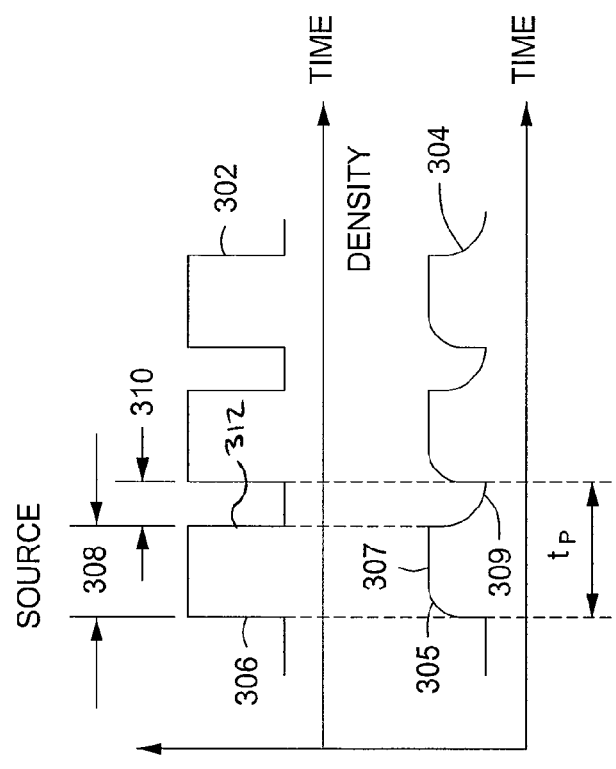
Figure 3C:
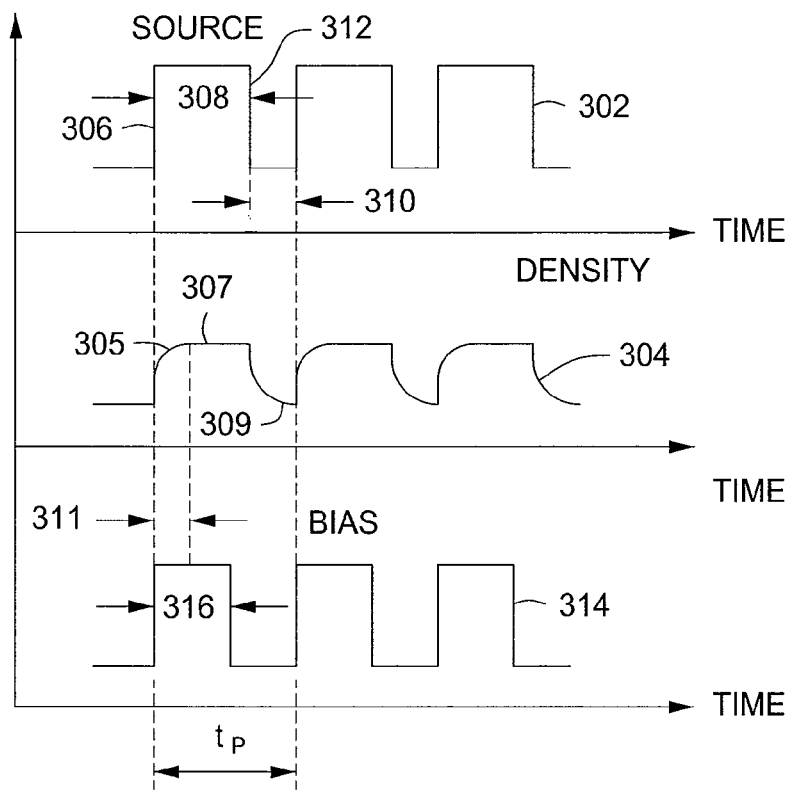
Figure 3D:
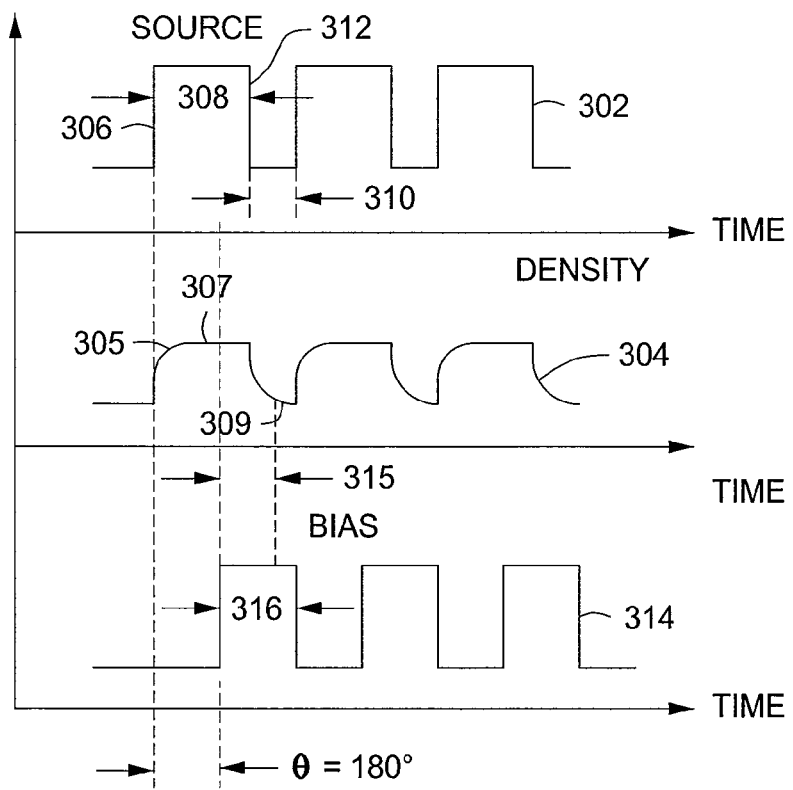
Figure 3E:
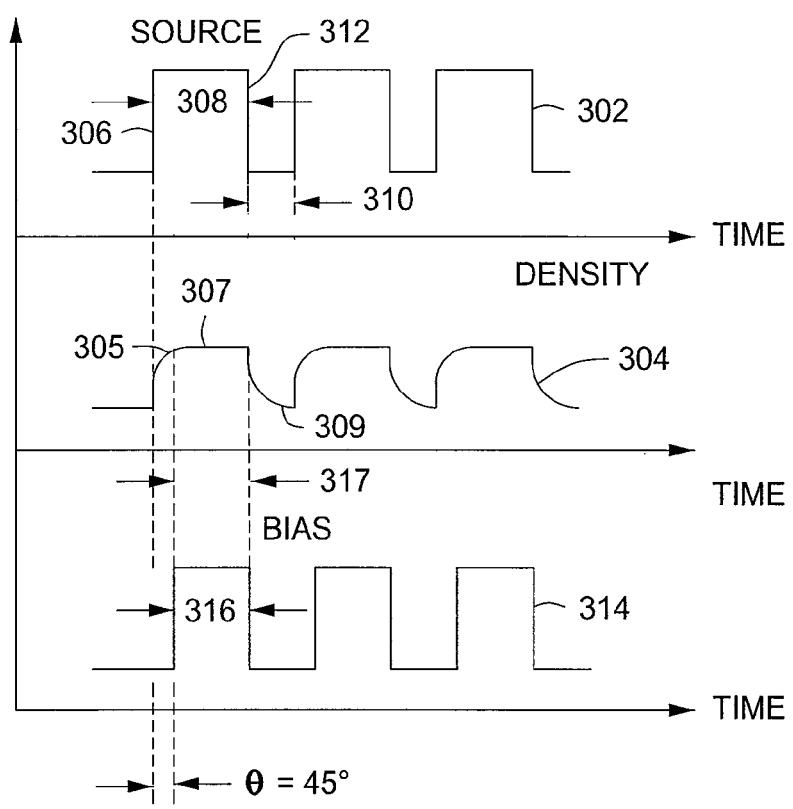

At 204, only a second RF signal (e.g., second RF signal 314 as illustrated in FIGS. 3C-E) may be applied to bias the plasma towards the substrate 114. The second RF signal 314 may be applied at the first frequency and a second duty cycle that is different from the first duty cycle. Similar to the first RF signal 302 discussed above, and based on the features of a pulsed RF output 300 as defined above and illustrated in FIG. 3A, the second RF signal 314 may have a second pulse duration, for example, ranging from about 0.01 milliseconds to about 0.1 seconds. The second RF signal 314 may have a pulse frequency ranging from about 10 Hz to about 100 kHz, or in some embodiments, about 0.1 to about 20 kHz. In some embodiments, the pulse frequency of the first and second RF signals 302, 314 may be the same. The second duty cycle may range from about 1 to about 99 percent, or in some embodiments, about 10 to about 90 percent. In some embodiments, the second duty cycle may be about 50 percent. The second RF signal 314 may be provided at a first power, for example, of about 10 to about 3000 watts. In some embodiments, the second power may be about 100 watts.

At 206, the phase variance may be adjusted between first RF signal and the second RF signal to control ion energy distribution in the plasma. For example, adjusting the phase variance may include controlling the phase lag of the second RF signal 314 relative to the first RF signal 302 to control the ion energy distribution in the plasma. For example, adjusting the phase variance may include controlling the phase lag of the second RF signal 314 relative to the first RF signal 302 to reduce charge build-up on the substrate 114, for example, such as a substrate including a dielectric layer as discussed below. In some embodiments, the phase lag may be up to about 270 degrees.

Control of the ion energy distribution may be utilized in combination with other concepts disclosed herein to reduce ion bombardment damage on the substrate. For example, adjusting the phase difference can include controlling the phase lag of the second RF signal 314 relative to the first RF signal 302 to reduce ion bombardment damage on the substrate 114. For example, FIGS. 3B depicts time domain waveforms of the first RF signal 302, e.g., a pulsed RF source power signal and a resultant ion density waveform 304 during the application of the first RF signal 302. For example, at a leading edge 306 of the "on" portion 308 of the first RF signal 302, the ion density may be initially low (as illustrated by the gradual rise of the ion density waveform 304 at the onset of the "on" portion 308 of the first RF signal 302). For example, the ion density may be at a low level 305 because the plasma is initially being formed from one or more process gases at the beginning of a processing step, or alternatively, because the plasma is in an afterglow regime during an "off" portion 310 of the first RF signal 302. As the "on" portion 308 of the first RF signal 302 progresses in time, the ion density eventually reaches a steady state level 307 from the low level 305. For example, the steady state level 307 of the ion density may be reached in about 2 to about 4 percent of the pulse duration of first RF signal 302. At a trailing edge 312 of the "on" portion 308, the first RF signal 302 may enter the "off" portion 310. However, the ion density may not immediately decrease to a baseline level 309. For example, as illustrated in FIG. 3B, the ion density trails off from the steady state level 307 to the baseline level 309 beyond the trailing edge of the 312 of the "on" portion 308 and into the "off" portion 310 of the first RF signal 302. The baseline level 309 may be a non-zero level of ion density, such as an afterglow regime of the plasma or the like.

FIGS. 3C-E depict contemporaneous time domain waveforms of the first RF signal 302, e.g., a pulsed RF source power and the second RF signal 314, e.g., a pulsed RF bias power synchronized together over a range of phase differences. For example, as illustrated in FIGS. 3C-E, the first RF signal 302 may have a first duty cycle of about 75 percent and the second RF signal 314 may have a second duty cycle of about 50 percent. However, the values of the first and second duty cycles for each RF signal 302, 314 are merely exemplary and other duty cycles, such as those duty cycles listed above may be used. Embodiments of the inventive methods 200 disclosed herein have first and second duty cycles which are different. As illustrated in FIGS. 3C-E, the first and second RF signals 302, 314 have the same pulse duration, $t_p$.

FIG. 3C depicts one exemplary form of synchronization between the first RF signal 302 and the second RF signal 314. In this exemplary embodiment, the phase lag of the second RF signal 314 relative to the first RF signal 302 is zero, or the first and second RF signals 302, 314 are pulsed in-phase. Accordingly, when the phase lag is zero between the first and second RF signals 302, 314 as illustrated in FIG. 3C, an overlap 311 may occur between the low density level 305 of ions formed proximate the leading edge 306 of the "on" portion 308 of the first RF signal 302 and an "on" portion 316 of the second RF signal 314 causing a larger than desired ion energy (i.e., ion flux) at the surface of the substrate 114. Accordingly, the larger than desired ion energy may result in ion bombardment damage on the substrate 114. The overlap 311 may be small, for example, ending as the ion density waveform 304 approaches the larger steady state level 307. For example, the overlap 311 may range from about 2 to about 4 percent of the pulse duration. However, the ion bombardment damage may result on the substrate 114 due to the strength of the "on" portion 316 of the second RF signal 314 being distributed over the low level 305 of the ion density during the overlap 311. As the ion density waveform 304 approaches the steady state level 307 (i.e., as the overlap 311 ends), the strength of the second RF signal 314 may be distributed over a larger ion density at the steady state level 307. This distribution of the second RF signal 314 over a larger ion density that occurs when the "on" portions 308, 316 of the first and second RF signals 302, 314 overlap at the steady state level 307 of the ion density may result in an ion energy that is lower on average that during the overlap 311.

For example, a similar ion bombardment damage may occur proximate the trailing edge 312 of the "on" portion 308 of the first RF signal 302 due to an overlap with the "on" portion 316 of the second RF signal 314. FIG. 3D depicts one exemplary form of synchronization between the first RF signal 302 and the second RF signal 314. In this exemplary embodiment, the phase lag of the second RF signal 314 relative to the first RF signal 302 is about 180 degrees, or the first and second RF signals 302, 314 are pulsed out-of-phase. For example, under the conditions where the first duty cycle is about 75 percent, the second duty cycle is about 50 percent, and the pulse duration is the same for each of the RF signals 302, 314, an overlap 315 of the "on" portion 316 of the second RF signal 314 may occur with a lower ion density, where the lower ion density occurs between the steady state level 307 (at the trailing edge 312 of the "on" portion of the first RF signal 302) and the baseline level 309 during the "off" portion 310 of the first RF signal 302. As discussed above for the overlap 311, the overlap 315 may be small, for example between about 2 to about 4 percent of the pulse duration. However, although the overlap 315 may be small, ion bombardment damage may result on the substrate 114 due to the strength of the "on" portion 316 of the second RF signal 314 being distributed over the lower level of the ion density during the overlap 315.

Accordingly, and for example, to reduce ion bombardment damage on the substrate 114 during etching with a synchronous pulsed plasma, the inventors provide a synchronous pulsed plasma method wherein the "on" portion of the second RF signal 314 may be embedded within the "on" portion 308 of the first RF signal 302. For example, FIG. 3E depicts one exemplary form of synchronization between the first RF signal 302 and the second RF signal 314 using embedded synchronous pulsing of a plasma. In this exemplary embodiment, the phase lag of the second RF signal 314 relative to the first RF signal 302 is about 45 degrees, such that the first and second RF signals 302, 314 are pulsed out-of-phase. As illustrated in FIG. 3E, an overlap 317 occurs between the "on" portion of the second RF signal 314 and only the steady state level 307 of the ion density. Accordingly, the overlap 317 may avoid any overlap with both the low level 305 of the ion density that occurs at the leading edge 306 of the "on" portion of the first RF signal 302 and a low ion density that occurs between the steady state level 307 and the baseline level 309 of the ion density during the "off" portion of the first RF signal 302. Thus, ion bombardment damage that may occur due to overlaps 311, 315 may be avoided.

The embodiments illustrated in FIG. 3E are merely exemplary and many embodiments of synchronous embedded pulsing of a plasma are possible. For example, using the first duty cycle of about 75 percent and the second duty cycle of about 50 percent as illustrated in FIGS. 3C-E, synchronous embedded pulsing may be achieved over a phase lag ranging from greater than about zero to about 90 degrees. For example, at a phase lag of greater than about zero includes a phase lag sufficient to avoid the overlap 311. For example, this phase lag may vary due to magnitude of the first RF signal 302, the type of process gas used to form the plasma, or other process parameters. For example, at a phase lag of about 90 degrees, the "on" portions 308, 316 of the first and second RF signals 302, 314 simultaneously end in the embodiments illustrated in FIGS. 3C-E. Thus, at a phase lag of about 90 degrees the overlap 315 may be avoided.

However, a range of phase lag over which a synchronous embedded pulsing of a plasma may occur can vary based on process conditions. For example, as discussed above the lower end of the range may vary due to any suitable factor which can cause the low level 305 of ion density to approach the steady state level 307 at a different rate. For example, the higher end of the range may vary due to similar factors discussed above for the lower end of the range, and further vary due to variation between the first and second duty cycles. For example, using a first duty cycle of about 75% and a second duty cycle of about 50% as illustrated in FIGS. 3C-E, the "on" portions 308, 316 of the first and second RF signals 302, 314 may simultaneously end at a phase lag of about 90%. Thus, the upper end of the range under those specific duty cycle conditions to avoid the overlap 315 may be about 90 degrees. However, if the first duty cycle is about 75 percent, and the second duty cycle is less than about 50 percent, for example, such as 25 percent, then the upper end of the range may extend to about 180 degrees and still avoid the overlap 315. Similarly, if the first duty cycle is about 75 percent, and the second duty cycle is greater than about 50 percent, for example, such as 60 percent, then the upper end of the range may extend only to about 54 degrees and still avoid the overlap 315.

At 208, the substrate 114 may be etched with the plasma. In some embodiments, the first and second RF signals 302, 314 may be synchronized within the context of synchronous embedded pulsing as discussed above to reduce ion bombardment damage on the substrate 114 while varying the phase between the first and second RF signals 302, 314, for example, to minimize charge-up on, and/or control etch rate of, the substrate 114.

For example, and in some embodiments, to minimize charging effects on the substrate 114 where the material is not a good conductor (e.g., a dielectric material), source and bias power may be pulsed synchronously. For example, and in some embodiments, etching of dielectric materials such as silicon dioxide selective to mask layers or underlayers is typically performed using a fluorocarbon chemistry, such as $CF_4$ or $C_4F_6$, in conjunction with an oxidizer such as $O_2$ or CO, and sometimes hydrogen or hydrocarbon chemistry as well. Typically, an electropositive gas such as Ar is added as a diluent. Unfortunately, the typical dielectric etch process gas chemistries do not form a significant population of negative ions; that is, the number density of electrons far exceeds the number density of negative ions. Consequently, there are unequal fluxes of oppositely charged ions to the substrate 114, leading to charging. Pulsing the plasma decreases plasma-on time, which can limit at least to some degree the charge damage, because the collapsed sheath allows for neutralization of accumulated charge. However, that is not a complete solution to the charging problem. Moreover, it does not address a problem of non-uniform radial distribution of plasma ion density.

Uniformity of the radial distribution of plasma ion density can be improved in a pulsed RF plasma dielectric etch process. For example, by adjusting the overlap between the RF envelopes of the first and second RF signals 302, 314, the plasma ion density non-uniformity can be minimized. This adjustment may be carried out as follows: if it is desired to make the ion distribution more center high, then the first and second RF signals 302, 314 can be adjusted to increase the "on" portion 308 of the first RF signal 302 relative to the "on" portion 316 of the second RF signal 314. If it is desired to make the ion distribution more edge high, then the "on" portion 316 of the second RF signal 314 may be increased relative to the "on" portion 308 of the first RF signal 302.

In some embodiments, a pulsed DC signal may be supplied, for example, from an DC pulse generator (not shown) to maintain a constant chucking force on the substrate 114 during plasma processing. For example, the chucking force can vary with the charge on the substrate 114 and cause damage or cracking of the substrate if not properly maintained. Further, variation in the chucking force may lead to variation in heat transfer from the substrate to the substrate support, undesirably leading to process variation and/or rejected substrates. The pulsed DC signal can be synchronized with the first and second RF signals 302, 314, for example, to provide a constant chucking force during plasma processing. In some embodiments, the pulsed DC signal is synchronized to be in phase with the first RF signal 302. For example, when the first RF signal 302 is "on", the DC signal is "on." When the first RF signal 302 is "off", the DC signal may be "off." Alternatively, the DC signal may be provided at "high" and "low" levels that respectively correspond with the "on" and "off" portions of the first RF signal 302.

Methods of processing a substrate are provided herein. The inventive methods may advantageously reduce ion bombardment damage on a substrate. Further, the inventive methods may advantageously reduce charge-up on surfaces of a substrate, such as a dielectric layer, while improving plasma uniformity and etch rate control.

While the foregoing is directed to embodiments of the present invention, other and further embodiments of the invention may be devised without departing from the basic scope thereof.

The invention claimed is:

1. A method of etching a substrate, comprising:
 generating a plasma by providing only a first RF signal having a first frequency and a first duty cycle;
 applying only a second RF signal to bias the plasma towards the substrate, wherein the second RF signal has the first frequency and a second duty cycle different than the first duty cycle, and wherein an "on" portion of the second RF signal is entirely embedded with an "on" portion of the first RF signal and does not overlap an "off" portion of the first RF signal;
 adjusting a phase variance between the first and second RF signals to control an ion energy distribution in the plasma, wherein adjusting the phase variance further includes controlling a phase lag of the second RF signal relative to the first RF signal to reduce ion bombardment damage on the substrate, and wherein the "on" portion of the second RF signal remains entirely embedded within the "on" portion of the first RF signal and does not overlap the "off" portion of the first RF signal after the phase lag of the second RF signal has been adjusted; and
 etching the substrate with the plasma.

2. The method of claim 1, where a pulse frequency of each of the first and second RF signals is about 10 Hz to about 100 kHz.

3. The method of claim 2, wherein the pulse frequency of each of the first and second RF signals is the same.

4. The method of claim 1, wherein the first and second duty cycles are about 1 to about 99 percent.

5. The method of claim 4, wherein the first duty cycle is about 75 percent and the second duty cycle is about 50 percent.

6. The method of claim 5, wherein a phase difference between the first and second RF signals ranges from about greater than about 0 degrees to less than about 90 degrees.

7. The method of claim 5, wherein the first RF signal is provided at a first power of about 100 to about 3000 watts and the second RF signal is provided at a second power of about 100 to about 3000 watts.

8. The method of claim 1, wherein the first frequency is about 400 kHz to about 27 MHz.

9. The method of claim 1, wherein adjusting the phase variance further comprises:
 controlling a phase lag of the second RF signal relative to the first RF signal to control the ion energy distribution in the plasma.

10. The method of claim 9, wherein the phase lag is up to about 270 degrees.

11. The method of claim 1, wherein the substrate is disposed in a processing volume of an inductively coupled plasma etching reactor having the first RF signal coupled to one or more inductive coils disposed above the processing volume and the second RF signal coupled to an electrode disposed in a substrate support of the reactor.

12. A method of etching a substrate disposed on a substrate support in the processing volume of an inductively coupled plasma etching reactor having one or more inductive coils disposed above the substrate support and external of the processing volume and an electrode disposed in the substrate support, comprising:
 generating a plasma by providing only a first RF signal having a first frequency and a first duty cycle;
 applying only a second RF signal to bias the plasma towards the substrate, wherein the second RF signal has the first frequency and a second duty cycle different than the first duty cycle, wherein an "on" portion of the second RF signal is entirely embedded within an "on" portion of the first RF signal and does not overlap an "off" portion of the first RF signal;
 adjusting a phase variance between the first and second RF signals to control an ion energy distribution in the plasma, wherein adjusting the phase variance further includes controlling a phase lag of the second RF signal relative to the first RF signal to reduce ion bombardment damage on the substrate, and wherein th "on" portion of the second RF signal remains entirely embedded within the "on" portion of the first RF signal and does not overlap the "off" portion of the first RF signal after the phase lag of the second RF signal has been adjusted; and etching the substrate with the plasma.

13. The method of claim 12, where a pulse frequency of each of the first and second RF signals is about 10 Hz to about 100 kHz, and wherein the pulse frequency of each of the first and second RF signals is the same.

14. The method of claim 13, wherein the first and second duty cycles are about 1 to about 99 percent.

15. The method of claim 14, wherein the first duty cycle is about 75 percent and the second duty cycle is about 50 percent and wherein a phase difference between the first and second RF signals ranges from about greater than about 0 degrees to less than about 90 degrees.

16. The method of claim 14, wherein the first RF signal is provided at a first power of about 100 to about 3000 watts and the second RF signal is provided at a second power of about 100 to about 3000 watts.

17. The method of claim 14, wherein adjusting the phase variance further comprises:

controlling a phase lag of the second RF signal relative to the first RF signal to control the ion energy distribution in the plasma.

18. The method of claim 17, wherein the phase lag ranges from about 0 to about 270 degrees.

\* \* \* \* \*